United States Patent [19]
Oh

[11] Patent Number: 5,925,113
[45] Date of Patent: *Jul. 20, 1999

[54] BURST MODE END DETECTION UNIT

[75] Inventor: Jong Hoon Oh, Kyoungki-do, Rep. of Korea

[73] Assignee: Hyundai Electronics Industries Co., Ltd., Kyoungki-do, Rep. of Korea

[*] Notice: This patent issued on a continued prosecution application filed under 37 CFR 1.53(d), and is subject to the twenty year patent term provisions of 35 U.S.C. 154(a)(2).
This patent is subject to a terminal disclaimer.

[21] Appl. No.: 08/645,674

[22] Filed: May 14, 1996

[30] Foreign Application Priority Data

May 15, 1995 [KR] Rep. of Korea ............... 95-11884

[51] Int. Cl.$^6$ ............... G06F 13/12; G06F 13/14
[52] U.S. Cl. ............... 710/35; 375/340
[58] Field of Search ............... 395/855, 306; 365/233.5; 375/340; 364/200; 371/20.4

[56] References Cited

U.S. PATENT DOCUMENTS

| | | | |
|---|---|---|---|
| 4,275,440 | 6/1981 | Adams | 364/200 |
| 4,458,357 | 7/1984 | Weymouth | 377/2 |
| 5,497,377 | 3/1996 | Muto et al. | 371/20.4 |
| 5,649,125 | 7/1997 | Tietjen et al. | 395/306 |
| 5,675,549 | 10/1997 | Ong | 365/233.5 |
| 5,675,974 | 10/1997 | Motamadi | 375/1 |

FOREIGN PATENT DOCUMENTS 7045069  2/1995  Japan.

Primary Examiner—Curtis A. Kuntz
Assistant Examiner—Ilwoo Park
Attorney, Agent, or Firm—Thelen, Reid & Priest, L.L.P.

[57] ABSTRACT

A burst mode end detection unit comprising a first decoding circuit for pre-decoding external burst length data, a plurality of counters being reset in response to a reset signal to generate different counts in response to a clock signal in such a manner that the counts are sequentially incremented by one, the reset signal being generated when a burst mode is designated, a second decoding circuit for decoding output signals from the counters, and a comparison circuit for comparing an output signal from the first decoding circuit with an output signal from the second decoding circuit and detecting an end time of the burst mode in accordance with the compared result. According to the present invention, the burst mode end detection unit can accurately detect the end time of the burst mode and notify a synchronous DRAM of the detected burst mode end time. Therefore, the synchronous DRAM can rapidly perform the subsequent operation.

5 Claims, 3 Drawing Sheets

BURST MODE END DETECTION UNIT

BACKGROUND OF THE INVENTION

1. Field of the Invention

The present invention relates in general to a burst mode control circuit for a synchronous dynamic random access memory (referred to hereinafter as "synchronous DRAM"), and more particularly to a burst mode end detection unit for accurately detecting the end time of a burst mode.

2. Description of the Prior Art

Recently, a synchronous DRAM has been operated in a burst mode to enhance the data access time.

In the burst mode, data are sequentially written in memory cells in the synchronous DRAM which are externally designated. Also, the stored data are successively read out from the designated memory cells. At this time, the data are written or read on the basis of bursts of specified length.

In other words, in the burst mode, the synchronous DRAM receives a start address and an information (i.e., burst length) regarding the number of memory locations which are to be successively accessed. Also, addresses which are sequentially incremented by one from the start address are generated to sequentially access corresponding memory cells in the synchronous DRAM. At this time, the number of the generated addresses is defined by the burst length.

At the moment that the burst mode is ended, the synchronous DRAM must automatically be changed to a standby mode to receive a command regarding a new burst mode. Also, a line for inputting a row address strobe signal RAS must be precharged. Further, address counting, writing and reading operations must be stopped. To this end, the synchronous DRAM requires means which is capable of accurately detecting the end time of the burst mode.

SUMMARY OF THE INVENTION

Therefore, the present invention has been made in view of the above problem, and it is an object of the present invention to provide a burst mode end detection unit for accurately detecting the end time of a burst mode.

In accordance with the present invention, the above and other objects can be accomplished by a provision of a burst mode end detection unit comprising first decoding means for pre-decoding external burst length data; a plurality of counting means being reset in response to a reset signal to generate different counts in response to a clock signal in such a manner that the counts are sequentially incremented by one, the reset signal being generated when a burst mode is designated; second decoding means for decoding output signals from the counting means; and comparison means for comparing an output signal from the first decoding means with an output signal from the second decoding means and detecting an end time of the burst mode in accordance with the compared result.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENTS

Figure 1:
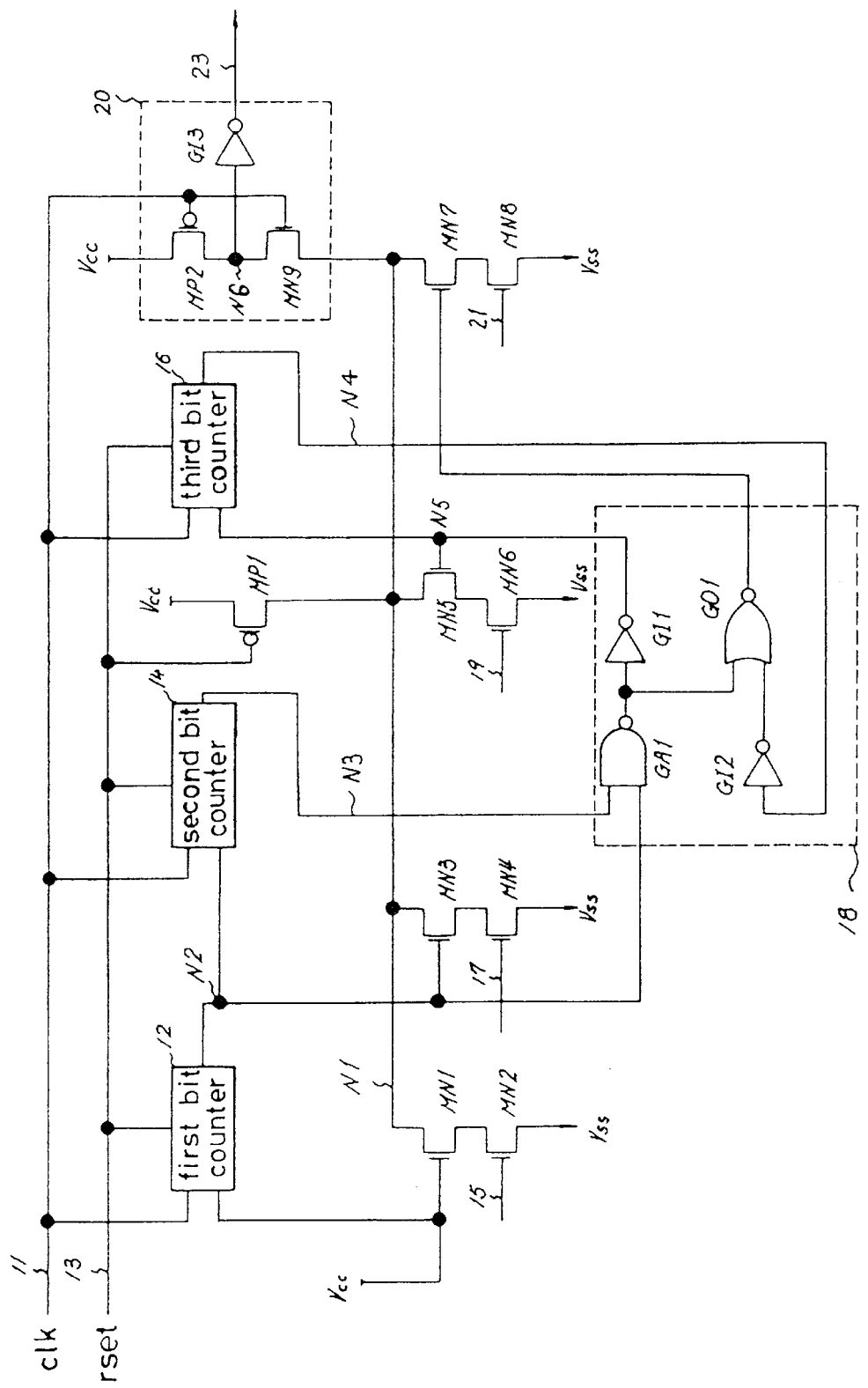
FIG. 1 is a circuit diagram of a burst mode end detection unit in accordance with an embodiment of the present invention.

Referring to FIG. 1, there is shown a circuit diagram of a burst mode end detection unit in accordance with an embodiment of the present invention. In accordance with the preferred embodiment of the present invention, the burst mode end detection unit is adapted to compare the present burst length with a burst length stored in a mode register and to generate a burst mode stop signal if they are the same as a result of the comparison. To this end, as shown in FIG. 1, the burst mode end detection unit comprises first to third bit counters 12, 14 and 16 for commonly inputting a clock signal clk from a clock signal input line 11 and a reset signal rset from a reset signal input line 13, a decoding circuit 18 for decoding first to third count signals cnt1–cnt3 at output nodes N2, N3 and N4 of the first to third bit counters 12, 14 and 16, and four NMOS transistor series circuits connected in parallel between a node N1 and a source of a ground voltage Vss. The first NMOS transistor series circuit is provided with first and second NMOS transistors MN1 and MN2 connected in series between the node N1 and the ground voltage source Vss. The first NMOS transistor MN1 has its gate terminal connected to a source of a supply voltage Vcc and the second NMOS transistor MN2 has its gate terminal connected to a first input line 15 for inputting a first pre-decoded signal indicating that the burst length is 1. The second NMOS transistor series circuit is provided with third and fourth NMOS transistors MN3 and MN4 connected in series between the node N1 and the ground voltage source Vss. The third NMOS transistor MN3 has its gate terminal connected to the node N2 and the fourth NMOS transistor MN4 has its gate terminal connected to a second input line 17 for inputting a second pre-decoded signal indicating that the burst length is 2. The third NMOS transistor series circuit is provided with fifth and sixth NMOS transistors MN5 and MN6 connected in series between the node N1 and the ground voltage source Vss. The fifth NMOS transistor MN5 has its gate terminal connected to a first output terminal of the decoding circuit 18 and the sixth NMOS transistor MN6 has its gate terminal connected to a third input line 19 for inputting a third pre-decoded signal indicating that the burst length is 4. The fourth NMOS transistor series circuit is provided with seventh and eighth NMOS transistors MN7 and MN8 connected in series between the node N1 and the ground voltage source Vss. The seventh NMOS transistor MN7 has its gate terminal connected to a second output terminal of the decoding circuit 18 and the eighth NMOS transistor MN8 has its gate terminal connected to a fourth input line 21 for inputting a fourth pre-decoded signal indicating that the burst length is 8.

The burst mode end detection unit further comprises a first PMOS transistor MP1 connected between the supply voltage source Vcc and the node N1. The first PMOS transistor MP1 has its gate terminal connected to the reset signal input line 13.

The burst mode end detection unit further comprises an output circuit 20 connected between the supply voltage source Vcc and the node N1. The output circuit 20 is adapted to transfer a logic signal at the node N1 to an output line 23 synchronously with the clock signal clk from the clock signal input line 11.

The operation of the burst mode end detection unit with the above-mentioned construction in accordance with the embodiment of the present invention will hereinafter be described in detail with reference to FIG. 2.

Figure 2:
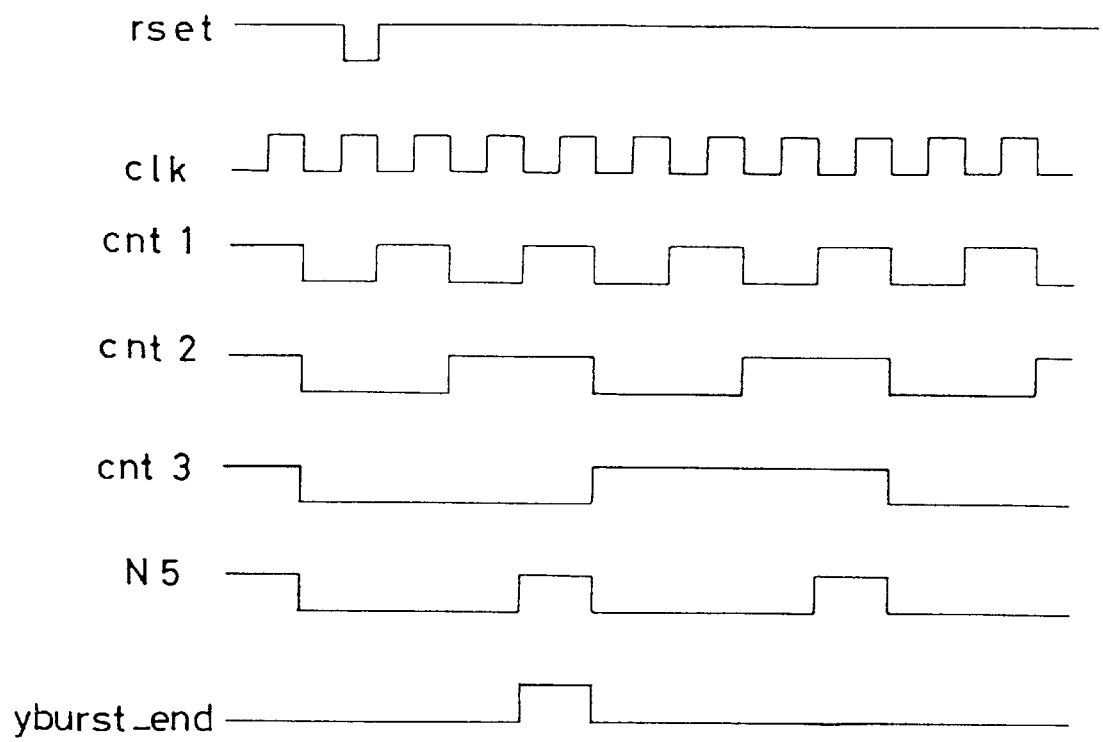
FIG. 2 is a timing diagram illustrating the operation of the burst mode end detection unit in accordance with the embodiment of the present invention.

FIG. 2 is a timing diagram illustrating the operation of the burst mode end detection unit in accordance with the embodiment of the present invention. The reset signal rset is generated at the reset signal input line 13 if a new burst command is applied at a first clock cycle of the clock signal clk from the clock signal input line 11. At this time, the output signals from the first to third bit counters 12, 14 and 16 are initialized into low in logic in response to the reset signal rset from the reset signal input line 13. Further, a burst mode control signal goes high in logic to notify a column control circuit (not shown) of the burst state. As a result, the burst mode (read or write) is started.

The first bit counter 12 performs its counting operation while the supply voltage Vcc is applied from the supply voltage source Vcc. While performing the counting operation, the first bit counter 12 inverts a logic signal at the output node N2 to generate the first count signal cnt1, whenever the clock signal clk from the clock signal input line 11 goes from high to low in logic.

The second bit counter 14 performs its counting operation while the first count signal cnt1 at the output node N2 of the first bit counter 12 is high in logic. While performing the counting operation, the second bit counter 14 inverts a logic signal at the output node N3 to generate the second count signal cnt2, whenever the clock signal clk from the clock signal input line 11 goes from high to low in logic under the condition that the first count signal cnt1 at the output node N2 of the first bit counter 12 is high in logic.

The decoding circuit 18 includes a NAND gate GA1 for NANDing the first and second count signals cnt1 and cnt2 at the output nodes N2 and N3 of the first and second bit counters 12 and 14, and a first inverter GI1 for inverting an output signal from the NAND gate GA1. The output signal from the NAND gate GA1 is low in logic when the output signals from the first and second bit counters 12 and 14 are both high in logic. As a result, the first inverter GI1 generates a first decoded signal which is high in logic when the output signals from the first and second bit counters 12 and 14 are both high in logic. The decoding circuit 18 further includes a second inverter GI2 for inverting the third count signal cnt3 at the output node N4 of the third bit counter 16, and a NOR gate GO1 for NORing the output signal from the NAND gate GA1 and an output signal from the second inverter GI2. The NOR gate GO1 generates a second decoded signal which is high in logic when the output signal from the NAND gate GA1 and the output signal from the second inverter GI2 are both low in logic.

The third bit counter 16 perform its counting operation while the first decoded signal from the first inverter GI1 in the decoding circuit 18 is high in logic. While performing the counting operation, the third bit counter 16 inverts a logic signal at the output node N4 to generate the third count signal cnt3, whenever the clock signal clk from the clock signal input line 11 goes from high to low in logic under the condition that the first decoded signal from the first inverter GI1 in the decoding circuit 18 is high in logic.

The four NMOS transistor series circuits are connected in parallel between the node N1 and the ground voltage source Vss. The first NMOS transistor series circuit provided with the first and second NMOS transistors MN1 and MN2 acts as a comparator for determining whether the burst length is 1. The first NMOS transistor MN1 remains at its ON state in response to the supply voltage Vcc from the supply voltage source Vcc being applied to the gate terminal thereof. As a result, the first NMOS transistor MN1 connects the mode N1 to the second NMOS transistor MN2. The second NMOS transistor MN2 is turned on when the first pre-decoded signal from the first input line 15 being applied to the gate terminal thereof is high in logic. As the second NMOS transistor MN2 is turned on, it connects the node N1 to the ground voltage source Vss, thereby causing a low logic signal to be generated at the node N1 to indicate the end of the burst mode. Noticeably, the first pre-decoded signal is generated from a burst length decoding circuit (not shown) when the burst length is 1. The burst length information is generated according to a program of a mode register (not shown). If a line on which the burst length information is placed is selected, it is maintained at a high logic state (supply voltage level Vcc) and the other lines are maintained at a low logic state (ground voltage level Vss).

The second NMOS transistor series circuit provided with the third and fourth NMOS transistors MN3 and MN4 acts as a comparator for determining whether the burst length is 2. The third NMOS transistor NM3 is turned on when the first count signal cnt1 from the output node N2 of the first bit counter 12 being applied to the gate terminal thereof is high in logic. As the third NMOS transistor NM3 is turned on, it connects the node N1 to the fourth NMOS transistor MN4. The fourth NMOS transistor MN4 is turned on when the second pre-decoded signal from the second input line 17 being applied to the gate terminal thereof is high in logic. As the fourth NMOS transistor NM4 is turned on, it connects the node N1 to the ground voltage source Vss, thereby causing a low logic signal to be generated at the node N1 to indicate the end of the burst mode. The second pre-decoded signal is generated from the burst length decoding circuit when the burst length is 2.

The third NMOS transistor series circuit provided with the fifth and sixth NMOS transistors MN5 and MN6 acts as a comparator for determining whether the burst length is 4. The fifth NMOS transistor MN5 is turned on when the first decoded signal from the first inverter GI1 in the decoding circuit 18 being applied to the gate terminal thereof is high in logic. As the fifth NMOS transistor MN5 is turned on, it connects the node N1 to the sixth NMOS transistor MN6. The sixth NMOS transistor MN6 is turned on when the third pre-decoded signal from the third input line 19 being applied to the gate terminal thereof is high in logic. As the sixth NMOS transistor MN6 is turned on, it connects the node N1 to the ground voltage source Vss, thereby causing a low logic signal to be generated at the node N1 to indicate the end of the burst mode. The third pre-decoded signal is generated from the burst length decoding circuit when the burst length is 4.

The fourth NMOS transistor series circuit provided with the seventh and eighth NMOS transistors MN7 and MN8 acts as a comparator for determining whether the burst length is 8. The seventh NMOS transistor MN7 is turned on when the second decoded signal from the NOR gate GO1 in the decoding circuit 18 being applied to the gate terminal thereof is high in logic. As the seventh NMOS transistor MN7 is turned on, it connects the node N1 to the eighth NMOS transistor MN8. The eighth NMOS transistor MN8 is turned on when the fourth pre-decoded signal from the fourth input line 21 being applied to the gate terminal thereof is high in logic. As the eighth NMOS transistor MN8 is turned on, it connects the node N1 to the ground voltage source Vss, thereby causing a low logic signal to be generated at the node N1 to indicate the end of the burst mode. The fourth pre-decoded signal is generated from the burst length decoding circuit when the burst length is 8.

The burst mode end detection unit further comprises the first PMOS transistor MP1 connected between the supply voltage source Vcc and the node N1, and the output circuit 20 connected between the supply voltage source Vcc and the node N1, for transferring a logic signal at the node N1 to the output line 23 synchronously with the clock signal clk from the clock signal input line 11. The first PMOS transistor MP1 has its gate terminal for inputting the reset signal rset from the reset signal input line 13. When the reset signal rset from the reset signal input line 13 has a low logic pulse duration, the first PMOS transistor MP1 is turned on to transfer the supply voltage Vcc from the supply voltage source Vcc to the node N1. As a result, the node N1 is charged with the voltage transferred by the first PMOS transistor MP1 and then remains at its high logic state until it is connected to the ground voltage source Vss by any one of the four NMOS transistor series circuits.

The output circuit 20 includes a ninth NMOS transistor MN9 connected between a node N6 and the node N1, a second PMOS transistor MP2 connected between the supply voltage source Vcc and the node N6, and a third inverter GI3 connected between the node N6 and the output line 23. The ninth NMOS transistor MN9 and the second PMOS transistor MP2 have their gate terminals for commonly inputting the clock signal clk from the clock signal input line 11. When the clock signal clk from the clock signal input line 11 is low in logic, the second PMOS transistor MP2 is turned on to transfer the supply voltage Vcc from the supply voltage source Vcc to the node N6. However, the ninth NMOS transistor MN9 is turned on when the clock signal clk from the clock signal input line 11 is high in logic. As the ninth NMOS transistor MN9 is turned on, it transfers a logic signal at the node N1 to the node N6. As a result, the logic signal at the node N1 is transferred to the node N6 while the clock signal clk from the clock signal input line 11 is high in logic. Then, the third inverter GI3 inverts the logic signal at the node N1 and supplies the inverted logic signal as a burst mode end signal yburst_end to the output line 23.

Figure 3:
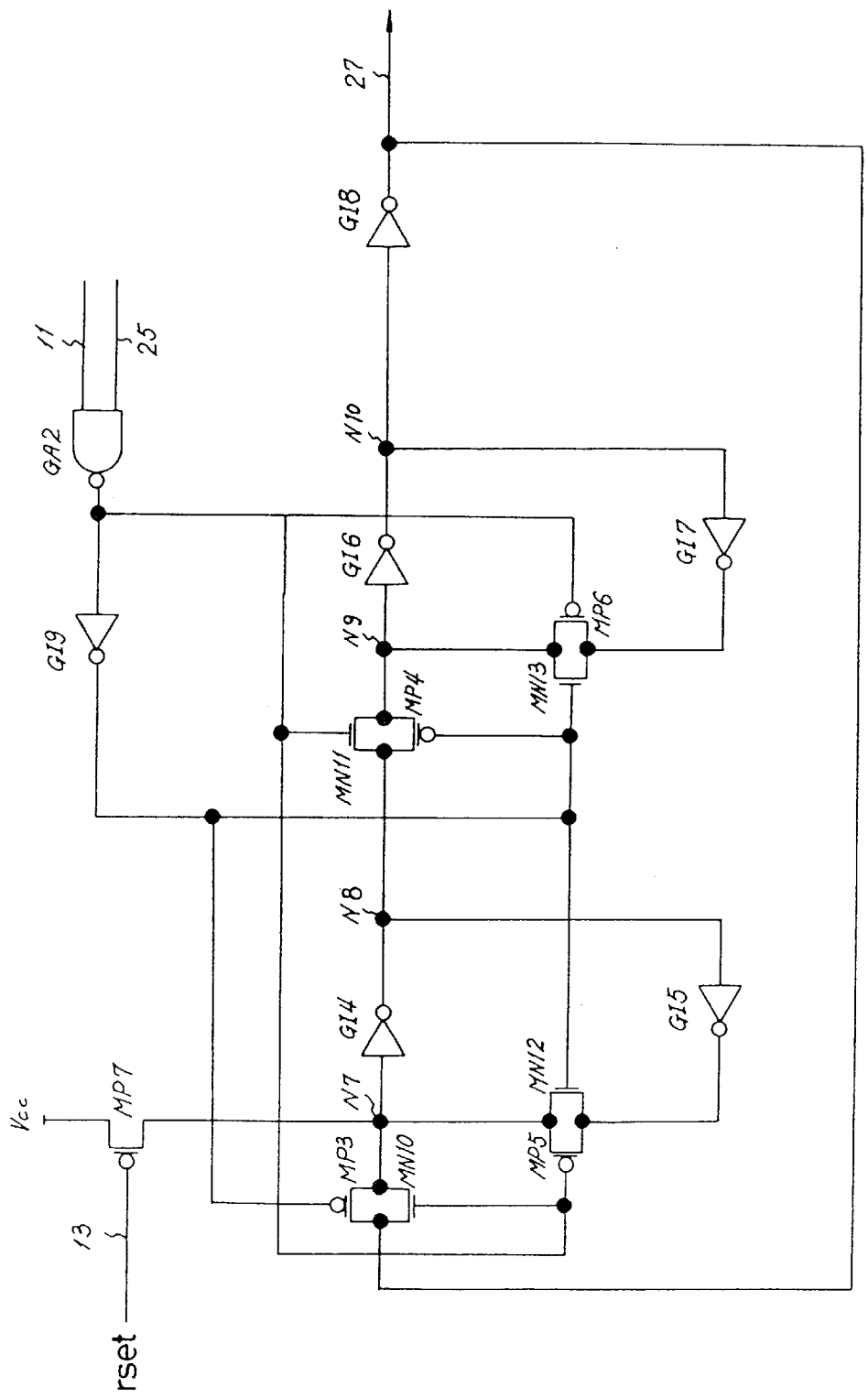
FIG. 3 is a detailed circuit diagram of a bit counter in FIG. 1.

Referring to FIG. 3, there is shown a detailed circuit diagram of each of the first to third bit counters 12, 14 and 16 in FIG. 1. As shown in this drawing, the bit counter includes two inverters GI4 and GI5 connected between nodes N7 and N8 to form a cyclic loop, and PMOS and NMOS transistors MP5 and MN12 for opening/closing the cyclic loop of the inverters GI4 and GI5 in response to a pulse signal from NAND gate GA2. The PMOS and NMOS transistors MP5 and MN12 are adapted to close the inverter cyclic loop when the pulse signal from the NAND gate GA2 is low in logic.

The bit counter further includes two inverters GI6 and GI7 connected between nodes N9 and N10 to form a cyclic loop, an inverter GI8 connected between the node N10 and an output line 27, and PMOS and NMOS transistors MP6 and MN13 for opening/closing the cyclic loop of the inverters GI6 and GI7 in response to the pulse signal from the NAND gate GA2. The PMOS and NMOS transistors MP6 and MN13 are adapted to close the inverter cyclic loop when the pulse signal from the NAND gate GA2 is low in logic. The inverter GI8 inverts a logic value (1 or 0) at the node N10 which is stored by the cyclic loop of the inverters GI6 and GI7 and transfers the inverted logic value to the output line 27.

The bit counter further includes NMOS and PMOS transistors MN10 and MP3 for transferring a logic signal on the output line 27 to the node N7 in response to the pulse signal from the NAND gate GA2, NMOS and PMOS transistors MN11 and MP4 for transferring a logic signal at the node N8 to the node N9 in response to the pulse signal from the NAND gate GA2, and an inverter GI9 for inverting the pulse signal from the NAND gate GA2. The NMOS and PMOS transistors MN10 and MP3 are adapted to transfer the logic signal on the output line 27 to the node N7 when the pulse signal from the NAND gate GA2 is "1" in logic. Similarly, the NMOS and PMOS transistors MN11 and MP4 are adapted to transfer the logic signal at the node N8 to the node N9 when the pulse signal from the NAND gate GA2 is "1" in logic. The pulse signal from the NAND gate GA2 is applied in common to gate terminals of the two NMOS transistors MN10 and MN11 and two PMOS transistors MP5 and MP6. The output signal from the inverter GI9 is applied in common to gate terminals of the two NMOS transistors MN12 and MN13 and two PMOS transistors MP3 and MP4.

The bit counter further includes a PMOS transistor MP7 connected between the supply voltage source Vcc and the node N7. The PMOS transistor MP7 has its gate terminal for inputting the reset signal rset from the reset signal input line 13. When the reset signal rset from the reset signal input line 13 has a low logic pulse duration, the PMOS transistor MP7 is turned on to perform an initialization function allowing a logic signal at the node N7 to become high. The NAND gate GA2 functions to invert the clock signal clk from the clock signal input line 11 when a switching control signal from an input line 25 is high in logic. The switching control signal from the input line 25 is the supply voltage Vcc from the supply voltage source Vcc in the case of the first bit counter 12, the first count signal cnt1 from the output node N2 of the first bit counter 12 in the case of the second bit counter 14 and the first decoded signal from the first inverter GI1 in the decoding circuit 18 in the case of the third bit counter 16.

As apparent from the above description, according to the present invention, the burst mode and detection unit can compare the number of generated addresses with the burst length and accurately detect the end time of the burst mode in accordance with the compared result. Further, the burst mode end detection unit can notify the synchronous DRAM of the detected burst mode end time. Therefore, the synchronous DRAM can rapidly perform the subsequent operation.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A burst mode end detection unit comprising:
   first decoding means for pre-decoding external burst length data;
   a plurality of counting means being reset in response to a reset signal to generate different counts in response to a clock signal in such a manner that the counts are sequentially incremented by one, the reset signal being generated when a burst mode is designated;
   second decoding means for decoding output signals from said counting means;
   receiving means for receiving the pre-decoded external burst length data; and
   comparison means for comparing an output signal from said first decoding means with an output signal from said second decoding means and detecting and end time of the burst mode in accordance with the compared result, wherein the active operation of said counting means is dependent on the value of the pre-decoded external burst length data.

2. A burst mode end detection unit as set forth in claim 1, further comprising output means for outputting an output signal from said comparison means synchronously with the clock signal.

3. A burst mode end detection unit comprising:

first decoding means for pre-decoding external burst length data;

a plurality of counting means being reset in response to a reset signal to generate different counts in response to a clock signal in such a manner that the counts are sequentially incremented by one, the reset signal being generated when a burst mode is designated;

second decoding means for decoding output signals from said counting means;

comparison means for comparing an output signal from said first decoding means with an output signal from said second decoding means and detecting an end time of the burst mode in accordance with the compared result; and output means for outputting an output signal from said comparison means synchronously with the clock signal, wherein said comparison means includes at least two transistor series circuits connected in parallel between an input terminal of said output means and a ground voltage source, for NANDing the output signal from said first decoding means and the output signals from said second decoding means.

4. A burst mode end detection unit as set forth in claim 3, further comprising initialization means for initializing a logic state at the input terminal of said output means in response to the reset signal when the burst mode is designated.

5. A burst mode end detection unit as set forth in claim 4, wherein said initialization means includes a MOS transistor.

* * * * *